(12) United States Patent
Sweet et al.

(10) Patent No.: US 6,403,277 B1
(45) Date of Patent: Jun. 11, 2002

(54) DIAZO DYES AND METHODS FOR THEIR USE

(75) Inventors: Norman Sweet, Waterford Township; Patrick Rich; Richard Folcik, both of Walled Lake, all of MI (US)

(73) Assignee: Precision Coatings, Inc., Walled Lake, MI (US)

( * ) Notice: Subject to any disclaimer, the term of this patent is extended or adjusted under 35 U.S.C. 154(b) by 0 days.

(21) Appl. No.: 09/055,563

(22) Filed: Apr. 6, 1998

Related U.S. Application Data

(63) Continuation-in-part of application No. 08/724,189, filed on Oct. 1, 1996, now Pat. No. 5,747,197, and a continuation-in-part of application No. 08/903,272, filed on Jul. 25, 1997, now abandoned, which is a continuation-in-part of application No. 08/523,636, filed on Sep. 5, 1995, now abandoned.

(51) Int. Cl.$^7$ .................................. G03C 5/18
(52) U.S. Cl. .................... 430/146; 149/183; 149/187; 534/683
(58) Field of Search ................ 430/149, 146, 430/183, 187; 534/683

(56) References Cited

U.S. PATENT DOCUMENTS

| | | | | |
|---|---|---|---|---|
| 3,063,050 A | * | 11/1962 | Millis | 346/1 |
| 3,305,361 A | | 2/1967 | Gaynor et al. | 96/48 |
| 3,373,438 A | | 3/1968 | Hochberg | 346/75 |
| 3,870,435 A | | 3/1975 | Watanabe et al. | 117/36.2 |
| 3,889,271 A | * | 6/1975 | Freytag et al. | 346/1 |
| 4,149,888 A | | 4/1979 | Loprest | 96/75 |
| 4,258,367 A | | 3/1981 | Mansukhani | 346/1.1 |
| 4,281,329 A | | 7/1981 | Yano et al. | 346/1.1 |
| 4,289,839 A | | 9/1981 | DiPippo | 430/177 |
| 4,373,020 A | | 2/1983 | Winslow | 430/339 |
| 4,382,262 A | * | 5/1983 | Savit | 346/1.1 |
| 4,482,489 A | * | 11/1984 | DiPippo | 534/556 |
| 4,788,129 A | | 11/1988 | Bouldin et al. | 430/273 |
| 4,841,037 A | | 6/1989 | Ohta et al. | 534/815 |
| 5,035,743 A | | 7/1991 | Amon et al. | 106/21 |
| 5,187,049 A | | 2/1993 | Sher et al. | 430/340 |
| 5,223,376 A | | 6/1993 | Hasegawa et al. | 430/326 |
| 5,240,807 A | | 8/1993 | Jain et al. | 430/148 |
| 5,395,432 A | | 3/1995 | Nelson et al. | 106/21 |
| 5,445,923 A | | 8/1995 | Takahashi et al. | 430/340 |
| 5,521,050 A | | 5/1996 | Henzel et al. | 430/269 |

* cited by examiner

Primary Examiner—Rosemary Ashton
(74) Attorney, Agent, or Firm—Gifford, Krass, Groh, Sprinkle, Anderson & Citkowski, P.C.

(57) ABSTRACT

There is disclosed herein a diazo dye which is the reaction product of a diazonium salt having the formula

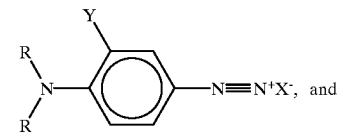

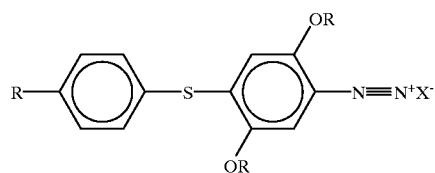

wherein R is hydrogen or an alkyl, Y is a halogen and X is an anion; with an aromatic coupling agent which is preferably of the formula

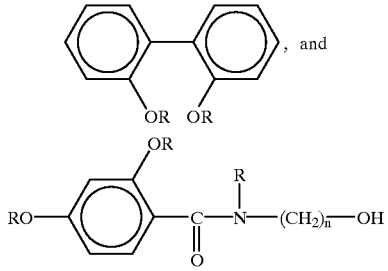

wherein R is hydrogen or an alkyl and n is 0 or a positive integer.

Also disclosed are methods for using the dye to form a phototool, including a method based upon a computer controlled ink jet printer.

4 Claims, 1 Drawing Sheet

DIAZO DYES AND METHODS FOR THEIR USE

RELATED APPLICATIONS

This application is a continuation-in-part of U.S. patent application Ser. No. 08/724,189 filed Oct. 1, 1996 now U.S. Pat. No. 5,747,197 and entitled "Method of Preparing a Phototool" and is also a continuation-in-part of U.S. patent application Ser. No. 08/903,272 filed Jul. 25, 1997 abandoned, which in turn is a continuation of U.S. patent application Ser. No. 08/523,636 filed Sep. 5, 1995, now abandoned, both of which are entitled "Computer Activated Diazo Printing System and Method."

FIELD OF THE INVENTION

This invention relates generally to diazo dyes. More specifically the invention relates to a class of diazo dyes having a very high absorption for ultraviolet radiation, and a relatively low absorption for visible light. In other aspects, the invention relates to imaging methods utilizing these dyes.

BACKGROUND OF THE INVENTION

Photolithographic and/or photoetch techniques are widely used in the fabrication of printed circuit boards, semiconductor devices, the preparation of printing plates, graphic arts, and a number of other such processes. Such photo techniques generally employ one or more masks, also referred to as phototools, which are often fabricated from a diazo based material.

Diazo dyes are based on the coupling reactions of various diazo compounds. These compounds, generally comprising a diazonium salt of an aromatic based nucleus, can undergo a chemical reaction with another molecular species, typically an aromatic compound referred to as a coupler, so as to form an azo dye compound. Such dyes typically have very high absorption coefficients, and by the appropriate choice of diazonium salt and coupler, various absorption spectra may be achieved. A variety of photographic systems which employ this basic reaction have been implemented. In some instances, light is used to initiate the coupling reaction, either by directly activating the reactants, or by unmasking a component of the system which undergoes further reaction. In other instances, light is employed to inactivate dye formation by inactivating one of the components of the system.

Diazo based dye systems have particular advantages in photolithography. The diazo system produces very high resolution allowing for preparation of finely detailed work. In addition, by appropriate choice of the imaging components, the absorption spectrum of the resultant azo dye can be optimized for particular applications. In accord with the present invention, there are provided diazo dye compounds which have very high optical absorptions in the near ultraviolet and violet portions of the spectrum, but have relatively low optical densities at longer wavelengths. A phototool or mask prepared from such materials has particular advantage in a number of techniques, since the low absorption at visible wavelengths allows for the ready positioning and alignment of a phototool with underlying structures, while the high optical density in the short wavelength regions is particularly well suited for absorbing the short wavelength illumination generally utilized in a number of photo techniques.

Dyes of the present invention may be employed in a number of applications. For example, the components of the dye, namely the diazonium salt and the coupler, may be incorporated into diazo imaging systems in which light either initiates a coupling reaction to form a negative imaging system, or inactivates a coupling reaction to form a direct positive imaging system. In other aspects of the present invention, the diazo dyes of the present invention may be directly synthesized, and subsequently applied to a substrate in an imagewise pattern, by printing or the like to form a photo mask. In other instances, an ink jet printer may be modified to use one or more components of the dye system of the present invention in order to generate a photo mask, and such a system may be placed under control of a computer for automated mask generation. These and other advantages and applications of the present invention will be apparent from the drawings, discussion and description which follow.

BRIEF DESCRIPTION OF THE INVENTION

There is disclosed herein a novel class of diazo dye compounds which are formed by the coupling reaction of a diazonium salt selected from the group consisting of:

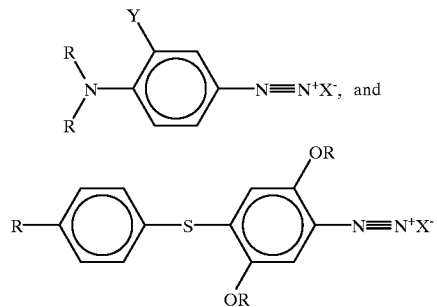

wherein R equals hydrogen or an alkyl group, which is most preferably methyl, ethyl or propyl; Y is a halogen, preferably chlorine or fluorine; and X may be any anion, and most typically comprises a halogen, $NO_3^-$, $HSO_4^-$, $BF_4^-$, $PF_6^-$, and the like.

Most preferably, the diazonium salts are coupled with aromatic molecules selected from the group consisting of:

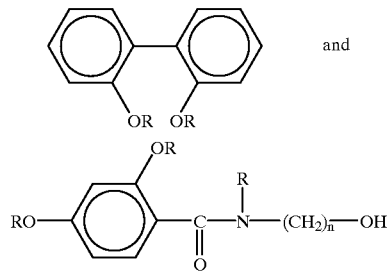

Most preferably, R is hydrogen or alkyl; n is 0 or a whole number, and is most preferably 1, 2 or 3.

The present invention is also directed to a method of making a photo mask comprising disposing an imagewise pattern of the foregoing diazo dye onto a substrate. The imagewise pattern may be formed by various printing techniques such as impact printing, ink jet printing, screen printing and the like.

In one specific embodiment, an ink jet imaging process, preferably under computer control, is utilized to generate an imagewise pattern of the dyes of the present invention. In this embodiment, a first imaging component is disposed in the cartridge of a jet printer, and a second component is disposed in a substrate which is addressed, in an imagewise manner, by the jet printer. The first and second components are selected so that they react to produce the diazo dyes of the present invention. In one particular embodiment, the first component comprises a base such as ammonium hydroxide, and the second component comprises the diazonium salt and coupler of the present invention, together with an acid which prevents their reaction. Neutralization of the acid by the base allows dye formation. In another embodiment, a diazonium salt is disposed in the cartridge of the ink jet printer, and the coupler is disposed in the substrate. In yet other embodiments, the coupler is disposed in the printer cartridge, and the diazonium salt is in the substrate.

DETAILED DESCRIPTION OF THE INVENTION

Figure 1:
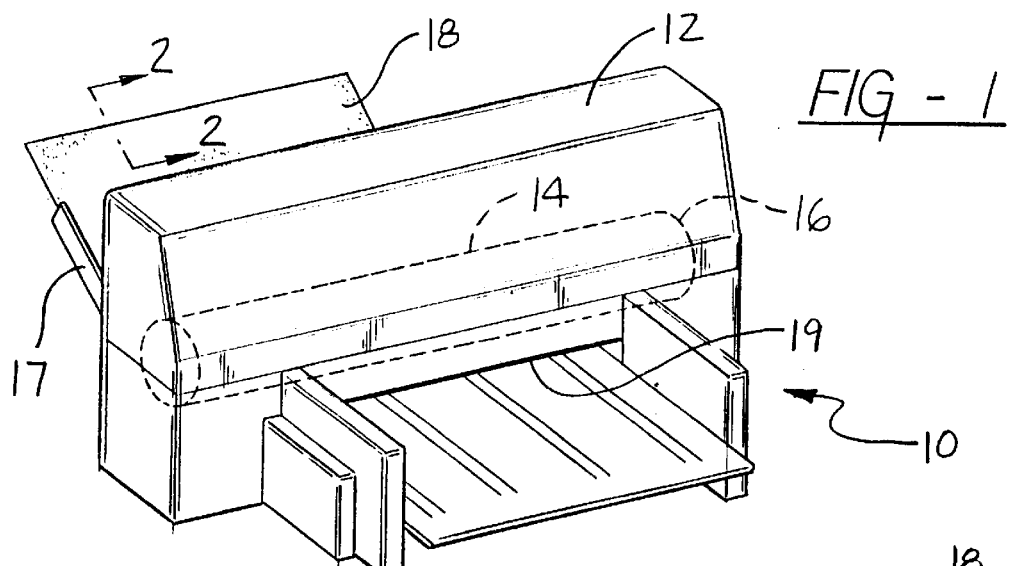
FIG. 1 is a perspective view of an ink jet printing system operative in accord with the principles of the present invention, and showing certain hidden structures thereof in phantom outline.

The present invention is directed to a unique class of diazo dyes. The dyes of the present invention absorb ultraviolet light, and near ultraviolet light very strongly, but are relatively transparent to the majority of the visible spectrum. These dyes may be advantageously employed in photo masks used in various applications such as the fabrication of semiconductor devices, circuit boards, printing plates and the like. Transparency of the dyes in the visible portions of the spectrum facilitates placement and alignment of photo masks, while their high optical density in the ultraviolet portions of the spectrum provide good contrast at those wavelengths typically employed in such graphic applications.

As is known in the art, azo dyes can be formed by the coupling of a diazonium salt with another organic molecule, typically an aromatic molecule. One particular diazonium salt which may be employed to form azo dyes having utility in the present invention is represented by Formula I hereinbelow:

Formula I

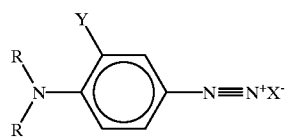

Another diazonium salt having utility in the practice of the present invention is defined by Formula II hereinbelow:

Formula II

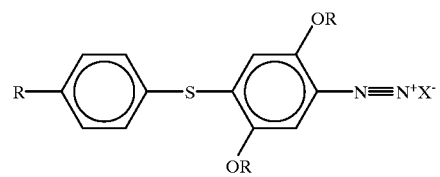

In both instances, R equals hydrogen or an alkyl group, most preferably methyl, ethyl, or propyl; Y is a halogen, preferably chlorine or fluorine; and X may be any anion, and most typically comprises a halogen, $NO_3^-$, $HSO_4^-$, $BF_4^-$, $PF_6^-$, and the like.

The coupler molecule which reacts with the diazonium salt to form the diazo dye is preferably an aromatic molecule. Some particularly preferred couplers are represented by Formulas III and IV hereinbelow:

Formula III

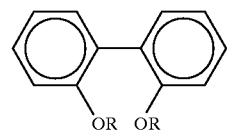

Formula IV

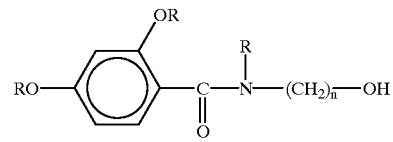

In the foregoing, R is hydrogen or alkyl as above, and for these particular couplers R is most preferably hydrogen or a low molecular weight alkyl; n is 0 or a whole number, and is most preferably 1, 2 or 3.

Azo dyes made in accord with the foregoing structural formulas are easily synthesized, stable on storage and readily incorporated into a variety of substrates. Some particular dyes which may be utilized in the present invention will be described hereinbelow, but it is to be understood that such examples are illustrative of the present invention, and not limitations upon the practice thereof.

A first dye having utility in the present invention is prepared from a diazonium salt of the general Formula I herein above, in which the halogen, Y, is chlorine and both R groups are ethyl. The cation of this salt may be referred to as p-diazonium-o-chloro-N,N-diethylaniline. Reaction of this ion with a coupler of the general Formula III in which both R groups are hydrogen (2,2'-dihydroxy-biphenyl), couples the diazonium nitrogen to one of the aromatic rings to liberate HX and form the resultant azo dye. The resultant dye has a pale yellow color to the eye and a high absorption in the ultraviolet portions of the spectrum, typically below 360 nanometers.

If the coupling reaction is carried out with a coupler of the general Formula IV in which both R's are hydrogen and n is 2 (beta-resorcylic acid-ethanolamide), the resultant dye will have a brownish color to the eye, and will be primarily absorbing of light in the visible portions of the spectrum.

A similar group of compounds were prepared by reacting a diazonium salt of the type represented by Formula I in which both of the R groups are methyl, with the aforedescribed couplers. The resultant diazo dyes were generally similar to those obtained through the use of the diethyl compound.

Another group of diazo dyes were prepared from a diazonium salt of the type represented by Formula II, in which the R group para to the sulfur is methyl and the remaining R groups which are attached to the oxygens, are both ethyl. The corresponding cation may be referred to as 1-diazonium-2,5-diethoxy-4-tolylmercapto-benzene. Coupling of this diazonium ion with either of the aforedescribed couplers produces an azo dye having a high absorption in the ultraviolet portions of the spectrum.

The dyes of the present invention may be employed in a variety of graphic arts applications. For example, the components of the dye, namely the salt and coupler, may be incorporated into a conventional diazo imaging system wherein an imagewise pattern of dye is formed by the action of light on imaging medium which incorporates these components. As is known in the art, such systems may be made to be positive or negative working depending upon specific chemistries employed to inhibit or promote reaction of the salt and coupler. In other instances, an imagewise pattern of the dye may be formed on a substrate by printing or otherwise dispensing the finished dye thereonto.

In another embodiment, ink jet imaging technology may be utilized, in conjunction with the dye system of the present invention. In the simplest form, an ink jet printer may simply dispense the previously synthesized dye of the present invention onto a substrate, which is preferably a light transparent, ink receptive substrate, of the type well known in the art. In such instance, the substrate will merely be a passive receptor of the dye. In other embodiments, the substrate will contain one or more components of the imaging system, and will thus be an active participant in the formation of the dye.

Figure 2:
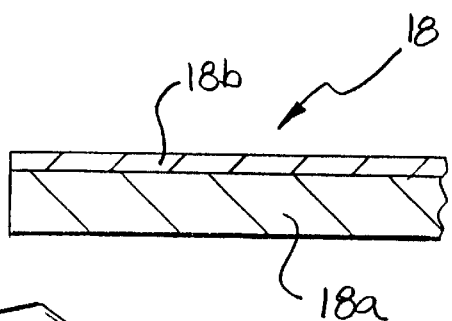
FIG. 2 is a cross-sectional view of a coated substrate useful in the practice of the present invention.

Throughout the following detailed description, like numerals are used to reference identical elements of the present invention shown in multiple figures thereof. Referring now to the drawings, and in particular to FIGS. 1 and 2, there is shown a system 10 for imprinting a substrate 18 with a diazo image, utilizing the dye system of the present invention. This system 10 includes a conventional ink jet printer 12 which includes an internally disposed reservoir or cartridge 14 for containing a supply of printing "ink" 16, which in this instance will comprise a diazo dye forming material. Of course, the ink jet printer 12 also includes numerous additional elements, such as ink nozzle, charging plates, charge electrode, etc. which are not considered germane to the practice of the present invention and are not depicted in FIG. 1. The type of ink jet printer depicted in the drawings is entirely conventional in construction and considered to be well within the knowledge of one skilled in the art.

Ink jet printer 12 also contains a supply of paper (or other printing substrate) 18 which is disposed in a paper supply tray 17. As can be seen more clearly in FIG. 2, the substrate 18 is multi-layer and has a base 18a, which is preferably transparent, with a coating 18b disposed thereon.

Figure 3:
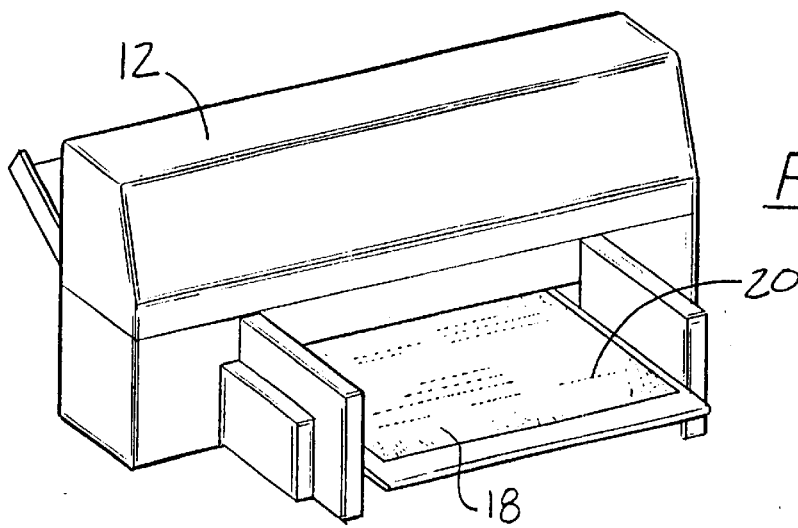
FIG. 3 is a perspective view of a substrate being imprinted according to one method of the present invention.

According to the present invention, the "ink" 16 disposed inside the ink reservoir 14 contains a first diazo imaging substance. Similarly, the coating 18b of the substrate 18 contains a second diazo imaging substance. The first and second diazo imaging substances are capable of reacting with each other to produce an image 20 comprised of the dye of the present invention. FIG. 3 depicts the system 10 of the present invention in operation with a sheet of substrate 18 emerging from a paper slot 19 and having an image 20 appearing thereon. Image 20 is produced by the reaction between the second diazo imaging substance in coating 18b and the first imaging substance in the printing ink 16 which has been imprinted onto the coated substrate 18 by operation of inkjet printer 12.

In the embodiment depicted in FIGS. 1–3, the first diazo substance may variously include: an alkalai, such as an ammonium hydroxide solution; a diazo solution (without coupler and without acid); or the coupler (without the diazo salts). In the embodiment where the ink 16 contains an alkaline solution, coating 18b of substrate 18 will include a diazo compound including the diazo salts and coupler of the present invention, and an acid. The reaction between the basic ammonium hydroxide in the ink 16 will cause an image to appear on the substrate as it emerges from the ink jet printer 12.

In the embodiment where the first diazo imaging substance of ink 16 includes a diazo salt solution, the paper 18 has a coating 18b which includes a coupler. By separating the diazo salt and the coupler in this manner, these two substances cannot react until they are brought together by the act of imprinting the ink onto the paper. Thus, no acid needs to be used to suppress the coupling reaction and, consequently, no ammonia vapors are necessary to neutralize the acid so that the coupling reaction can go forward.

Furthermore, this embodiment possesses the advantage that the coupler coated paper is not light sensitive and can be handled in a normal manner. Hence, the printing process can be carried out under normal white light. It is also possible to reverse the first and second diazo imaging substances so that the coupler is supplied in the ink cartridge 14, and the diazo salt solution is disposed on the paper 18. Again, the coupling reaction will not occur until the paper is imprinted with the ink to produce a visible diazo image.

Figure 4:
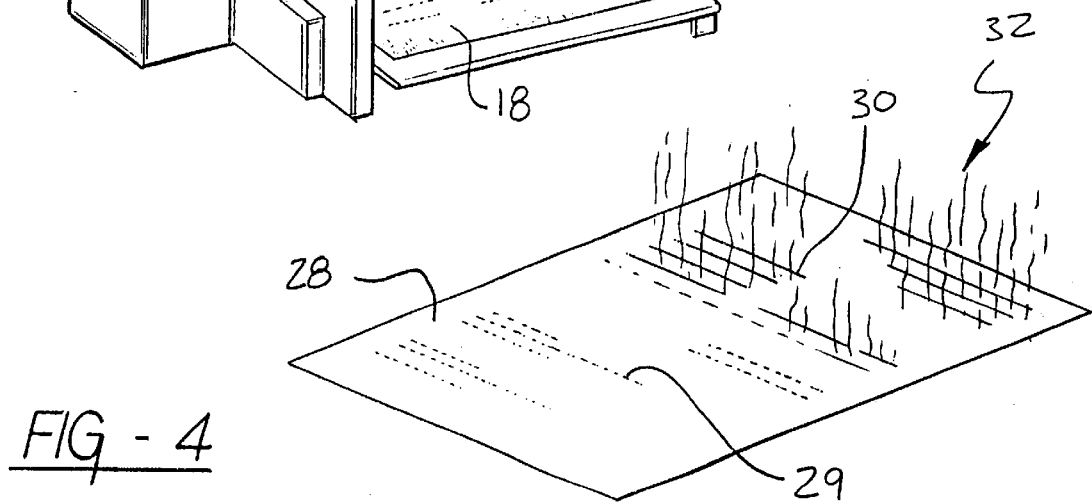
FIG. 4 illustrates a further step in an alternative embodiment of the present invention.

In another embodiment of the diazo printing system and method of the present invention, plain, uncoated substrates are employed, and an ink containing a diazo compound, a coupler, and acid is used in the ink jet printer or other imaging device to imprint the plain substrate with a latent diazo image 29, as can be seen by examining FIG. 4. FIG. 4 depicts the additional step of development which must be performed with this embodiment. The latent image 29 is exposed to ammonia vapors 32 to develop into a visible diazo image 30. While this embodiment has the advantage of using plain paper, it does require this additional development step.

Of course, the ink containing the first diazo imaging substance will also normally contain other components and, most particularly a carrier or solvent (such as water, various alcohols, other organic solvents, etc.) which will vary depending upon the particular diazo imaging substance used. Additionally, it may be necessary to include a resin binder to help adherence of the ink to the substrate, as is conventional and well known in the art of formulating inks suitable for use in ink jet printers. Other components may also be present, such as one or more conductivity agents, defoamers, surfactants, corrosion inhibitors, plasticizers, thickeners, drying agents, etc.

Thus, there has been described herein a diazo printing system and method which employs an ink jet printer including a cartridge filled with an ink having a first diazo imaging substance. The ink is imprinted upon to a substrate which is coated with a second diazo imaging substance to form a visible diazo image thereon.

The resultant image, as is characteristic of images produced by the present invention is highly opaque to ultraviolet light, but relatively transparent to visible light. Hence, the system of the present invention is particularly useful for producing intermediate screens and masks on transparent or translucent substrates. Due to the high quality of the diazo image produced, these intermediate masks and screens can be used in such high quality printing processes as silk screening, lithography, photo-lithography, etc. The system and method of the present invention have the particular advantage of employing an ink jet printer so that the system is easy to interface with computer based CAD and graphic design systems. Since the ink jet printer, impact printer or plotter is already designed to print computer generated and digitally stored images, it is possible to use the present system to create a diazo image directly from a design displayed on or stored in a computer.

It will thus be appreciated that the present invention is directed to a novel class of diazo dyes. These dyes have light absorption characteristics which make them particularly useful as photo masks. In accord with the present invention, the dye may be applied, in an imagewise manner, to a substrate, through the use of computer controlled printing processes such as ink jet printing. In view of the disclosure and examples presented herein, yet other embodiments of the present invention will be apparent to one of skill in the art. Therefore, the foregoing drawings, discussion and description are illustrative of particular embodiments of the present invention, but are not meant to be limitations upon the practice thereof. It is the following claims, including all equivalents, which define the scope of the invention.

What is claimed is:

1. A diazo dye, said dye comprising the reaction product of an aromatic coupling agent with a diazonium salt comprising:

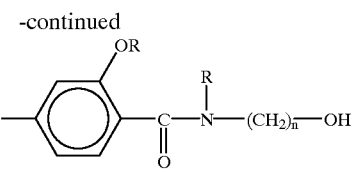

wherein R is hydrogen or an alkyl, Y is a halogen and X is an anion selected from the group consisting of: halogens, $NO_3^-$, $HSO_4^-$, $BF_4^-$, and $PF_6^-$; and wherein said aromatic coupling agent is selected from the group consisting of:

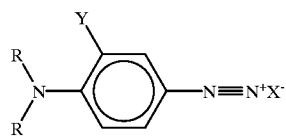, and

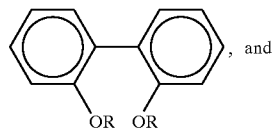

wherein R is hydrogen or an alkyl and n is 0 or a positive integer.

2. A method for making a phototool, said method comprising the step of:

forming an imagewise pattern of a diazo dye on a substrate, said dye comprising the reaction product of an aromatic coupling agent with a diazonium salt comprising:

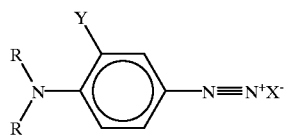

wherein R is hydrogen or an alkyl, Y is a halogen and X is an anion selected from the group consisting of: halogens, $NO_3^-$, $HSO_4^-$, $BF_4^-$, and $PF_6^-$; and wherein said aromatic coupling agent is selected from the group consisting of:

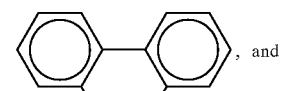, and

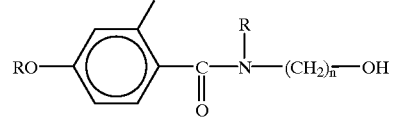

wherein R is hydrogen or an alkyl and n is 0 or a positive integer.

3. A method as in claim 2, wherein the step of forming an imagewise pattern of said diazo dye comprises forming said dye upon said substrate.

4. A method as in claim 2, wherein the step of forming an imagewise pattern of said diazo dye comprises forming said dye separate from said substrate, and applying said dye to said substrate in an imagewise pattern.

* * * * *